United States Patent
Karl

(10) Patent No.: US 9,139,140 B2
(45) Date of Patent: Sep. 22, 2015

(54) CAMERA FOR A VEHICLE

(75) Inventor: Matthias Karl, Ettlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 621 days.

(21) Appl. No.: 13/265,270

(22) PCT Filed: Jun. 23, 2010

(86) PCT No.: PCT/EP2010/058872
§ 371 (c)(1),
(2), (4) Date: Oct. 19, 2011

(87) PCT Pub. No.: WO2011/000746
PCT Pub. Date: Jan. 6, 2011

(65) Prior Publication Data
US 2012/0033079 A1 Feb. 9, 2012

(30) Foreign Application Priority Data

Jul. 1, 2009 (DE) .......................... 10 2009 027 372

(51) Int. Cl.
*H04N 7/18* (2006.01)
*B60R 11/04* (2006.01)
*H04N 5/225* (2006.01)
*H04N 5/232* (2006.01)

(52) U.S. Cl.
CPC .............. *B60R 11/04* (2013.01); *H04N 5/2254* (2013.01); *H04N 5/23212* (2013.01)

(58) Field of Classification Search
USPC ............ 348/46, 49, 335, 340, 307; 250/336.1
See application file for complete search history.

(56) References Cited

U.S. PATENT DOCUMENTS

| 7,410,266 | B2 * | 8/2008 | Seo et al. ................. 359/851 |
| 8,254,635 | B2 * | 8/2012 | Stein et al. .............. 382/103 |
| 8,380,060 | B2 * | 2/2013 | Georgiev et al. ......... 396/332 |
| 2006/0138498 | A1 | 6/2006 | Kim |
| 2007/0096010 | A1 | 5/2007 | Pallaro et al. |
| 2008/0142685 | A1 | 6/2008 | Gazeley |
| 2010/0253826 | A1 * | 10/2010 | Green et al. ............. 348/335 |

FOREIGN PATENT DOCUMENTS

| CN | 101065955 | 10/2007 |
| CN | 101169511 | 4/2008 |

(Continued)

OTHER PUBLICATIONS

Reinhard Völkel [Optical Engineering, vol. 3, Issue 11, 3323-3330 (Nov. 1, 1996). doi:10.1117/1.601080].*

(Continued)

*Primary Examiner* — Geepy Pe
(74) *Attorney, Agent, or Firm* — Kenyon & Kenyon LLP

(57) ABSTRACT

A camera for a vehicle, in particular for monitoring the exterior environment. The camera having: an imager having a plurality of pixels, having different imager regions for different object distances, and an objective situated before the imager. Between the objective and the imager there is provided an additional optical unit that has in particular optical microelements, e.g., microlenses, the additional optical unit having different imaging properties for the imager regions of the imager, in particular for the compensation of different object distances and/or image distances.

22 Claims, 13 Drawing Sheets

(56) References Cited

FOREIGN PATENT DOCUMENTS

| DE | 10323560 | 12/2004 |
|----|----------|---------|
| EP | 1764835  | 3/2007  |

OTHER PUBLICATIONS

International Search Report, PCT International Application No. PCT/EP2010/058872, dated Sep. 16, 2010.

* cited by examiner

CAMERA FOR A VEHICLE

BACKGROUND INFORMATION

Video systems in vehicles are used in particular to realize various primary driver assistance systems, e.g., night vision systems, video warning systems, lane recognition, lighting assistance, etc. Here, the camera acquires the environment surrounding the vehicle through a vehicle window, in particular the front windshield. In general, here the object distance is set to infinite. Other regions having finite object distance are then however not imaged sharply.

Furthermore, cameras are also conventionally used for secondary functions, e.g., the detection of raindrops on the external surface of the window; here, in general light, in particular infrared radiation, is radiated into the window and is detected using the imager of the camera. In such systems, a separate imager region can be provided for this radiation. However, such systems require an additional outlay that is specific to the vehicle or to the window.

U.S. Patent Application Publication No. 2007/0096010 A1 describes a multifunctional optical sensor as a CCD or CMOS element whose sensitive surface is divided into subregions provided for different functions. Here, microlenses or microprisms are placed before the individual pixels in order to achieve desired imaging characteristics, in particular focusing characteristics. In this way, the overall optical system is formed by these microlenses or microprisms. However, this requires very expensive and vehicle-specific designs of, for example, the microprisms.

The acquisition of different acquisition regions by a camera using a single imager is also described in, for example, German Patent No. DE 103 23 560 A1. Here, on the one hand a region outside the vehicle is acquired for driver assistance functions, via a first imager region. In addition, a mirror, in particular a convex mirror, is used to acquire a region above the vehicle, in particular vertically above it. In this way, a brightness signal can be produced as a function of the image signals. Such systems already enable versatile use of a single imager or image sensor for a plurality of functions. However, a significant apparatus outlay is required, due to additional convex mirrors or other optical devices provided externally or before the objective of the camera.

SUMMARY

According to an example embodiment of the present invention, between the objective and the imager an additional optical unit is provided that has different imaging characteristics or imaging functions for different imager regions or subregions of the sensitive surface of the imager. These different imaging properties can in particular be different focal lengths and/or object distances.

Thus, according to the example embodiment of the present invention different focal lengths and/or object distances are formed for different imager regions or subregions of the imager using the optical system made up of the objective and the subsequently situated additional optical unit.

The different imager regions here correspond to different acquisition regions of the camera. Thus, using the same imager different functions can be carried out in the different imager regions. Here, a single objective is used for the overall imager, and different focus settings, or the compensation of different image planes, based on the different object distances are achieved by the additional optical unit.

The additional optical unit can advantageously be fastened directly on the imager or imager bearer. It can include in particular optical microelements, e.g., microlenses or microprisms, as well as light-conducting tubes and reflective separating walls that can achieve desired imaging characteristics specifically for each pixel or for a plurality of pixels. In particular, the optical microelements can each be assigned to an individual pixel, and different optical means can be provided for the different subregions, or imager regions.

Thus, the additional optical unit differs from that shown in e.g., German Patent No. DE 103 23 560 A1 in that it is situated not before the objective but rather between the objective and the imager, in particular directly on the imager or imager bearer, such that focusing preferably takes place to different object distances. Unlike in U.S. Patent Application Publication No. 2007/0096010 A1, an additional objective is provided.

According to an example embodiment of the present invention, one imager region can be made without microelements and another imager region can be equipped with microelements. In addition, according to the example embodiment of the present invention optical microelements can however be provided for all the imager regions, the microelements then having different imaging characteristics for the different imager regions.

According to a particularly preferred embodiment, the optical microelements can compensate differing image planes that result from different object distances of the different acquisition regions, in particular an infinite object distance and a finite object distance. Thus, for example a first imager region can be assigned to the infinite object distance and a second imager region can be assigned to a finite object distance, the second imager region then having an image plane that is displaced towards the rear, which is compensated according to the present invention by a stronger focusing of the optical means or micromeans of the additional optical unit. For this purpose, on the second pixels of the second imager region there can for example be provided stacks of microlenses having spacers, and/or prisms or microlenses that cover a plurality of pixels, or also microlenses, via spacers.

The example embodiment of the present invention achieves some advantages. It enables the use of a camera having a simple objective without the use of expensive additional elements, e.g., with only one additional mirror fastened to a lens hood for deflecting the region of acquisition. In this way, a camera having a camera mount can be provided for different vehicle types such that only the imager has to be specifically adapted, or it is even possible to use the same imager for different vehicles by carrying out a focusing or adjustment to a relevant region, such as the window surface, by setting the relevant region to be sharp while the imager is switched on, by displacing either the camera together with the camera housing in the camera mount and/or displacing the combination of imager and objective within the camera housing, which is mounted fixedly opposite the window. Alternatively or in addition, a plurality of optical microelements, e.g., microlenses, having different object distances, one of which is then always correctly focused, can also be provided next to one another on the additional optical unit.

It is also advantageous that the additional optical unit does not require additional installation space, is easy to install, and is intolerant to fluctuations in focal depth. In addition, according to the present invention the primary driver assistance function is not disturbed by the secondary function.

A further advantage is that the demands made on the mechanical tolerances of the additional optical unit according to the example embodiment of the present invention are not as great as is the case with the exclusive use of optical elements situated close to the imager, such as microlenses. Thus, for example the use of additional optical elements or microelements that cover a plurality of pixels, such as a larger microlens or a larger prism, can achieve lower sensitivity to manufacturing tolerances. Such additional optical means, due to their technical similarity to previously standard structures of microlenses, can be derived from a running production series with a relatively low outlay for modification.

The example system according to the present invention is also advantageous when compared to systems that focus using optical units placed before the objective with different object distances, because such systems are relatively expensive and must be designed in each case for specific vehicle windows or vehicles, resulting in corresponding costs.

According to an example embodiment of the present invention, microlenses can even be placed over individual pixels, so that, relative to existing systems, only a few microlenses are omitted. In addition, conventional microlenses can be stacked in order to achieve the modified focusing characteristics. Here, the choice of the lenses and/or choice of the spacers between the lenses can also easily compensate imaging errors in the edge region of the imager, or differences regarding the focus range to the front windshield.

According to an example embodiment of the present invention, as a primary function an external space monitoring, or acquisition of the environment surrounding the camera, can in particular be carried out for various driver assistance systems, in particular night vision devices, lane recognition, traffic monitoring, such as the acquisition of other vehicles in traffic, lighting assistance, trajectory recognition, recognition of traffic signs, etc. The additional function or secondary function can in particular be the acquisition of the external surface of the windshield, e.g., for rain detection or detection of a coating. In this way, the second subregion for this second function can be focused on a significantly shorter object distance, which can be achieved in a suitable manner using the additional optical unit according to an example embodiment of the present invention.

DETAILED DESCRIPTION OF EXAMPLE EMBODIMENTS

Figure 1:
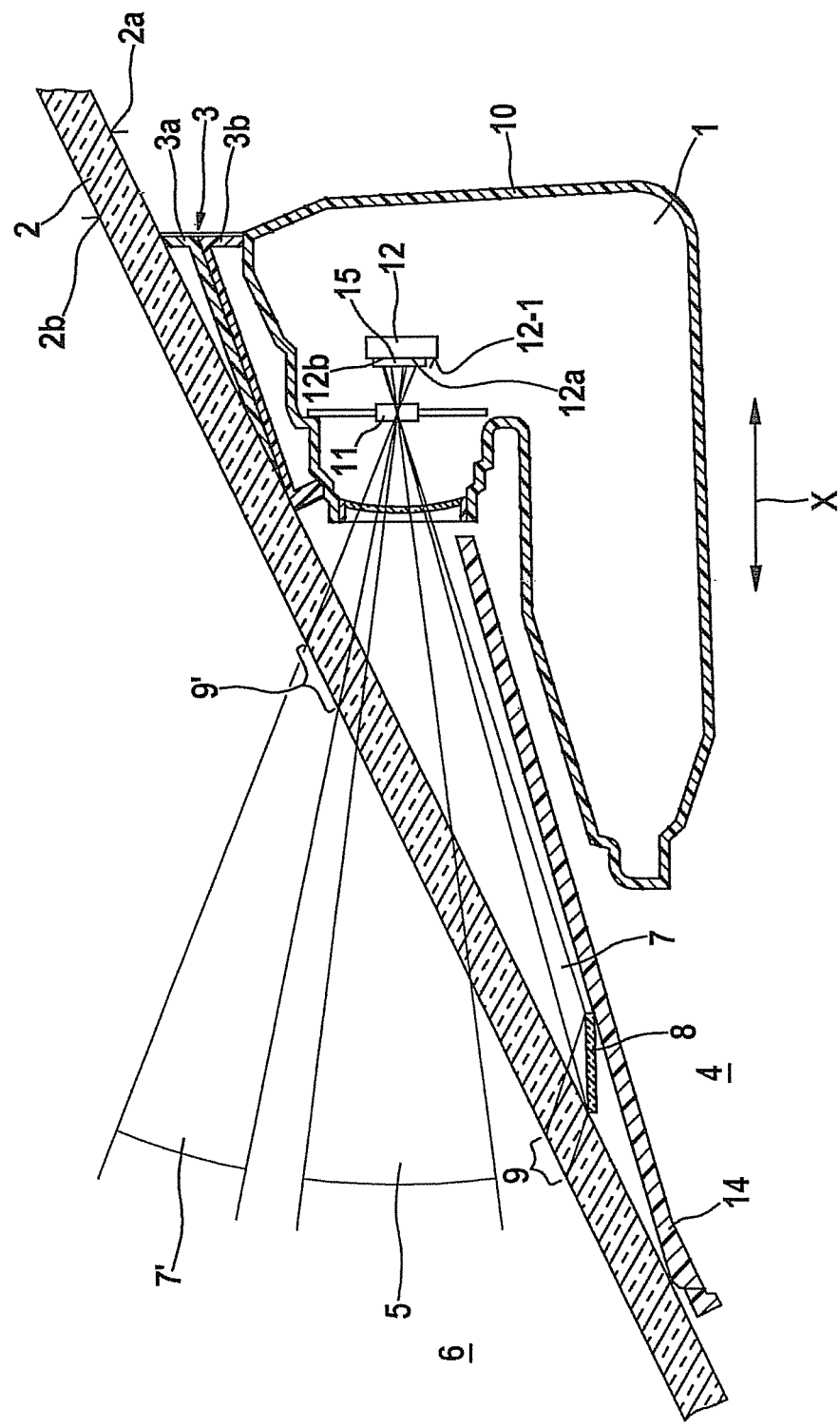
FIG. 1 shows a camera according to a specific embodiment of the present invention attached to a vehicle window.

According to FIG. 1, a camera 1 is attached to an inner side 2a of a vehicle window 2. For this purpose, a camera mount 3 can be provided that enables displacement of camera 1, e.g., in the longitudinal direction, or x direction, of the vehicle, or also in a direction deviating somewhat therefrom, e.g., also in the x-z plane, where z is the vertical direction or height direction of the vehicle. For this purpose, in FIG. 1 an outer mounting frame 3a is shown schematically, fastened to vehicle window 2, and a frame inner part 3b displaceable therein is shown, together forming mounting frame 3. It is relevant that a displacement of camera 1 is possible not only parallel to vehicle window 2, but in particular also in a manner not parallel thereto. Vehicle window 2 can in particular be the front windshield, but can for example also be the rear window.

Camera 1 is attached in vehicle interior 4. In a first acquisition region 5, which is generally a solid angle, it acquires a part of the environment 6 surrounding the vehicle for various primary functions, and in a second acquisition range 7 it acquires a region 9 of the outside 2b of the window, for one or more secondary functions. Here, first acquisition region 5 can be used for various driver assistance systems, in particular the acquisition of a part of the environment 6 surrounding the vehicle for representation on a display device, in particular for a night vision system, and/or for distance detection, lane detection, traffic sign recognition, and detection of other vehicles in traffic. Via second acquisition region 7, as a secondary function in particular the detection of external side 2b of vehicle window 2 can be enabled, e.g., as a rain detector or for the detection of relevant coatings on window external side 2b.

Camera 1 has a camera housing 10, an objective 11 having, e.g., a suitable lens system, and an imager 12, or imager chip, which, as a CCD or CMOS module, has in a conventional manner a sensitive surface having a system of pixels. In addition, a lens hood 14 is provided that is attached between camera 1 and internal side 2a of vehicle window 2. Imager 12 thus has, on its sensitive surface 12-1, a first imager region 12a for first acquisition region 5 and a second imager region 12b for acquired region 9 of window external side 2b.

Acquisition regions 5 and 7 can be further defined by an additional optical element outside camera 1. According to FIG. 1, a mirror 8 is provided before camera 1, e.g., is attached to lens hood 14, said mirror deflecting acquisition region 7 upward and/or to the front. According to the present invention, mirror 8 can here be made flat, so that it does not change the focusing.

In the depicted use of mirror 8, second acquisition region 7 is situated underneath first acquisition region 5, and second imager region 12b is situated on the sensitive surface 12-1 of imager 12, above first imager region 12a. In addition, the design of a modified specific embodiment is also depicted in which no mirror 8 is present; in this case, second acquisition region 7' is situated above first acquisition region 5, and acquires a region 9' on window external side 2b, and in this case, differently than shown, second imager region 12b is then situated underneath first imager region 12a.

According to the present invention, an additional optical unit 15 is provided close to imager 12 in camera 1, between objective 11 and imager 12, said additional optical unit being described in more detail in relation to various specific embodiments shown in the following Figures.

Figure 2:
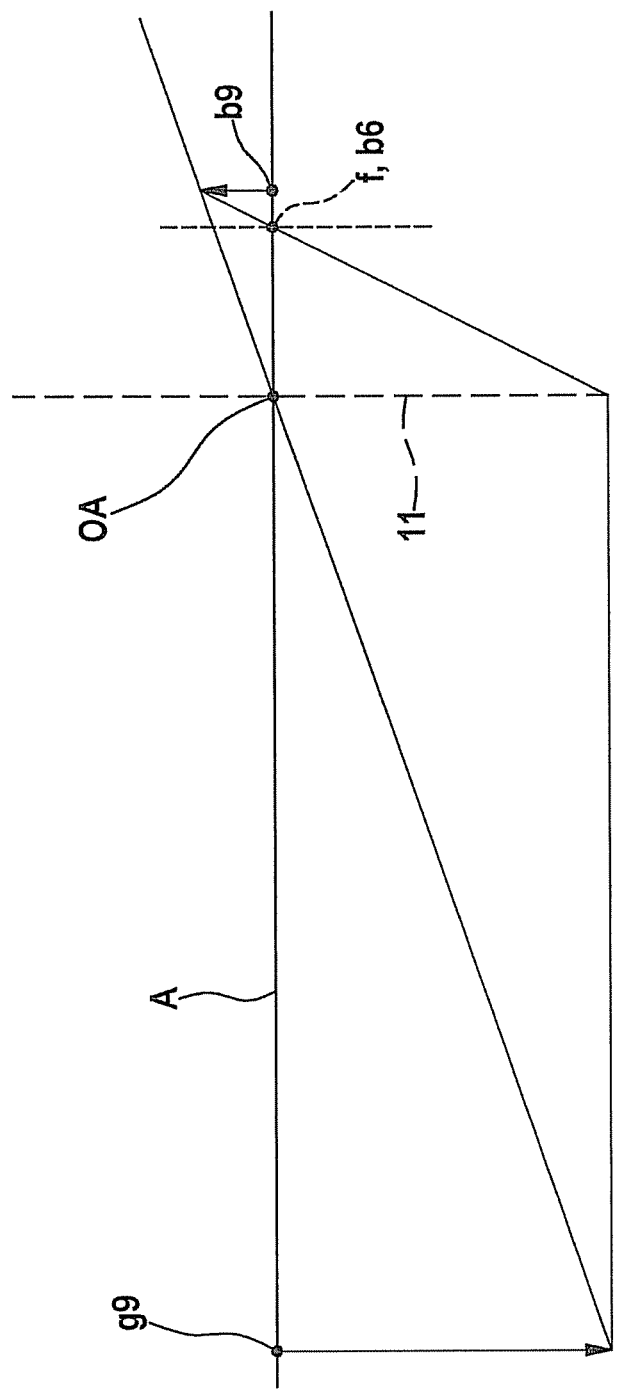
FIG. 2 shows a schematic representation of the optical beam path of the camera according to the example embodiment of the present invention.

FIG. 2 shows the basic design or principle of operation according to an example embodiment of the present invention of additional optical unit 15 situated close to the imager.

In FIG. 2, objective 11 is shown schematically on optical axis A in null point 0 (the objective is shown in simplified fashion as a plane situated perpendicular to optical axis A), and focal length f is shown of objective 11, which acts as the primary optical unit and is seen first in FIG. 2. In addition, an object distance g9 of region 9 of window outer side 2b, as well as the associated image distance b9, are shown. An object in region 9, e.g., a raindrop, is thus represented at image distance b9 in a conventional manner, according to this representation of the optical beam path.

In addition, in its first acquisition region 5 camera 1 acquires regions of environment 6 surrounding the vehicle with an infinite object distance, so that these regions are represented at a shorter image distance b6, which thus agrees at first with focal length f of objective 11 if additional optical unit 15, as a secondary optical unit, is not taken into account. Here, the depicted angles and size relationships are somewhat exaggerated in order to illustrate the underlying principle. The optical beam path shown in FIG. 2 shows that, due to the different object distances of the two acquisition regions 5 and 7, offset image planes result with the use of the same objective 11. According to the example embodiment of the present invention, this is compensated by additional optical unit 15, acting as a secondary optical unit, so that both region 9 of window external surface 2b and environment 6 surrounding the vehicle can be represented together on imager 12 with infinite object distance. For this purpose, according to the example embodiment of the present invention additional optical unit 15 is provided between objective 11 and imager 12, and is in particular attached directly on the surface of imager 12.

Additional optical unit 15 is fashioned differently for subregions 12a and 12b of sensitive surface 12-1 of imager 12, and can thus be divided into first optical additional element 15a and second optical additional element 15b which are fashioned differently; here for example one of the two, in particular first optical additional element 15a, may be omitted, so that second optical additional element 15b then brings about a stronger focusing in order to shift the second image plane forward onto sensitive surface 12-1 of imager 12. Here, in the specific embodiments additional elements 15a, 15b are advantageously optical microelements.

Additional optical unit 15 is advantageously fashioned in pixel-specific manner, and has arrangements that each acquire, or are allocated to, a single pixel or a plurality of pixels. FIGS. 3 through 13 show corresponding embodiments.

Figure 3:
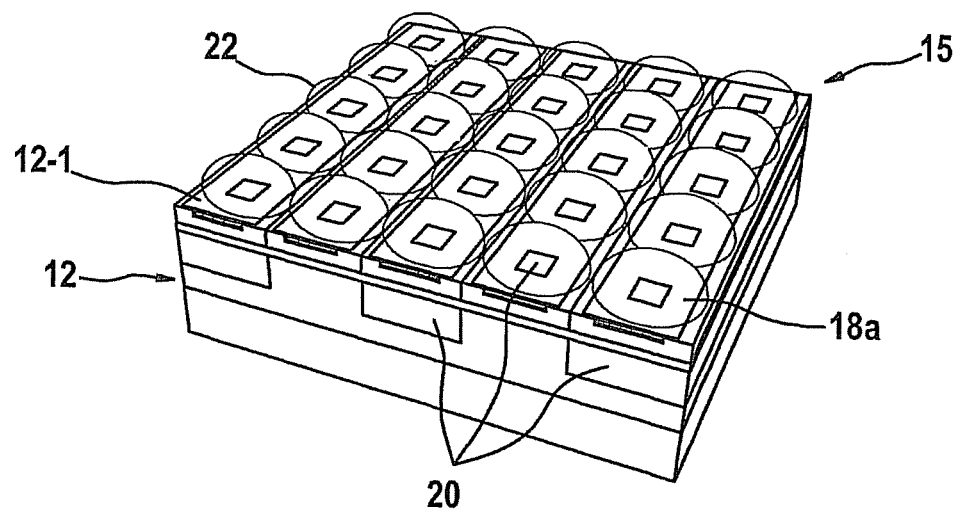
FIG. 3 shows a perspective view of the imager having a microlens system acting as an additional optical unit according to an example embodiment of the present invention.
Figure 4:
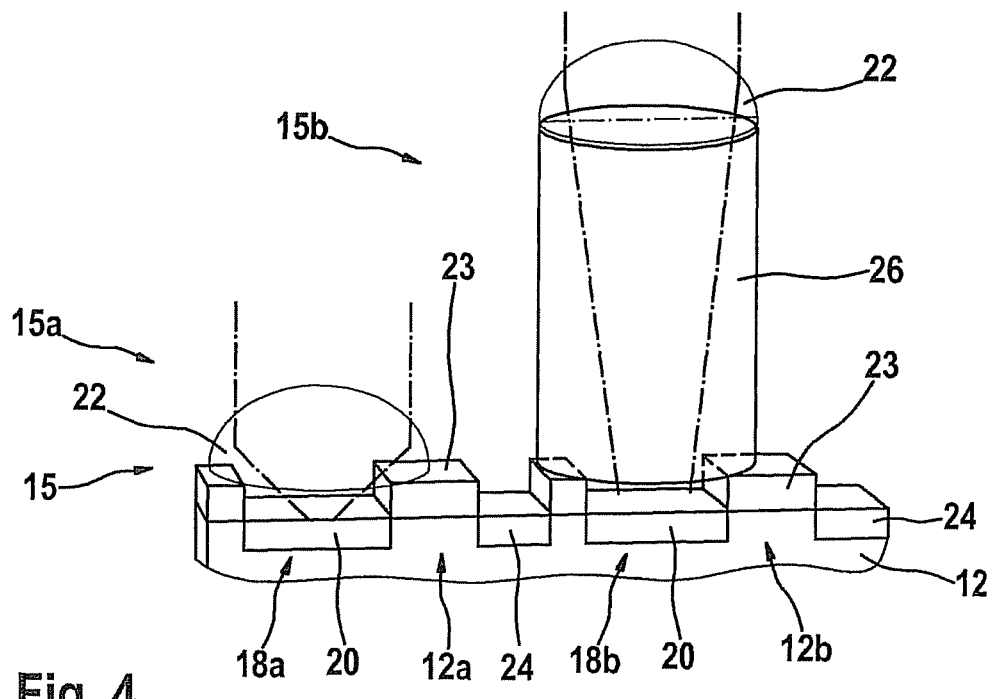
FIG. 4 shows the design of an additional optical unit according to the present invention according to a specific embodiment having a light-conducting tube.

FIG. 4 shows a region of imager 12 having two pixels 18a, 18b, fashioned in a conventional manner by microstructuring. In principle, here imager 12 may be designed as a CMOS, or also as a CCD component. Pixels 18a, b can in particular be provided with different color filters in order to enable color differentiation for corresponding functions, e.g., as a Bayer pattern. FIG. 3 shows first imager region 12a with first optical arrangement of additional optical unit 15 in a perspective view; here, first pixels 18a of this system form for example a Bayer pattern.

A respective microlens 22 is here directly attached as a first optical arrangement above the respective photodiode 20 for each first pixel 18a in first imager region 12a, i.e., for acquisition region 5 with infinite object distance. Microlens 22 is made of a transparent material, and its surface shape, i.e., diameter, height, and curvature, is adapted to the refraction index of its material so as to suitably focus incident radiation onto photodiode 20 situated under it. Microlens 22 is here for example accommodated or fastened on exposure gates 23. Drains 24 are also shown.

According to FIG. 4, microlenses 22 in first imager region 12a are fastened directly on pixels 18a or for example on exposure gates 23. In second imager region 12b having larger focal length with second pixels 18b, other optical microelements, here microlenses 22, are attached to light conductors 26, in particular light-conducting tubes 26, which in turn are attached to the exposure gates 23 of pixels 18b. Light-conducting tubes 26 thus act as a spacer block with internal beam guiding. They can be fashioned for example as solid cylinders made of transparent material, or as hollow cylinders; a design using glass fibers 26 as light-conducting tubes is in particular possible.

In the system shown in FIG. 1, focal length f of objective 11, as the primary fixed-focus optical unit before imager 12, can have e.g. the value f=7 mm, and imager 12, or sensitive surface 12-1, can have a height B=512×5.6 μm=2.87 mm; in this case, region 9 is sharply imaged on second imager region 12b. Thus, a height of Bp=482×5.6 μm=2.70 mm is available for the primary image. The distance or image distance b between the primary fixed-focus optical unit of objective 11 and imager 12 is determined by focal length f and by the desired optimal sharpness distance, i.e., object distance g. The following holds: $1/f=1/b+1/g$, i.e., $b=fg/(g-f) \approx f$ for $g \gg f$, i.e., g is very large relative to f, which is achieved in driver assistance functions where g≈20,000 mm.

In contrast, the distance, or object distance, gs to region 9 of window external side 2b is significantly less, e.g. gs≈80 mm. Thus, given an unchanged distance b of imager 12 to objective 11, the following is to be used for focal length $f_R$ of the resulting optical overall system 11, 15:

$$1/f_R=1/b+1/gs, \text{i.e.,} f_R=1/(1/gs+1/b)=1/(1/gs+(1/f-1/g)) \approx 6.439 \text{ mm.}$$

The focusing according to the example embodiment of the present invention therefore takes place by displacing camera 1 together with frame inner part 3b relative to mounting frame 3a attached to vehicle window 2, and/or by displacing the optical system made up of objective 11 together with imager 12 and additional optical unit 15 in camera housing 10 in a direction that is not parallel to vehicle window 2, i.e., not only in the y direction (vehicle transverse direction), and not along vehicle window 2. This displacement can take place in particular in the x direction, i.e., toward the front and toward the rear. Here, the image signal of imager 12, or of second imager region 12b, is recorded and is focused onto an object in region 9.

In FIGS. 5 through 12, first imager region 12a of imager surface 12-1 of imager 12 having first pixels 18a is unchanged in order to show various further specific embodiments of second imager region 12b. However, corresponding specific embodiments are also possible having other first optical elements 15a or other imager regions 12a, e.g., also not having microlenses 22.

Figure 5:
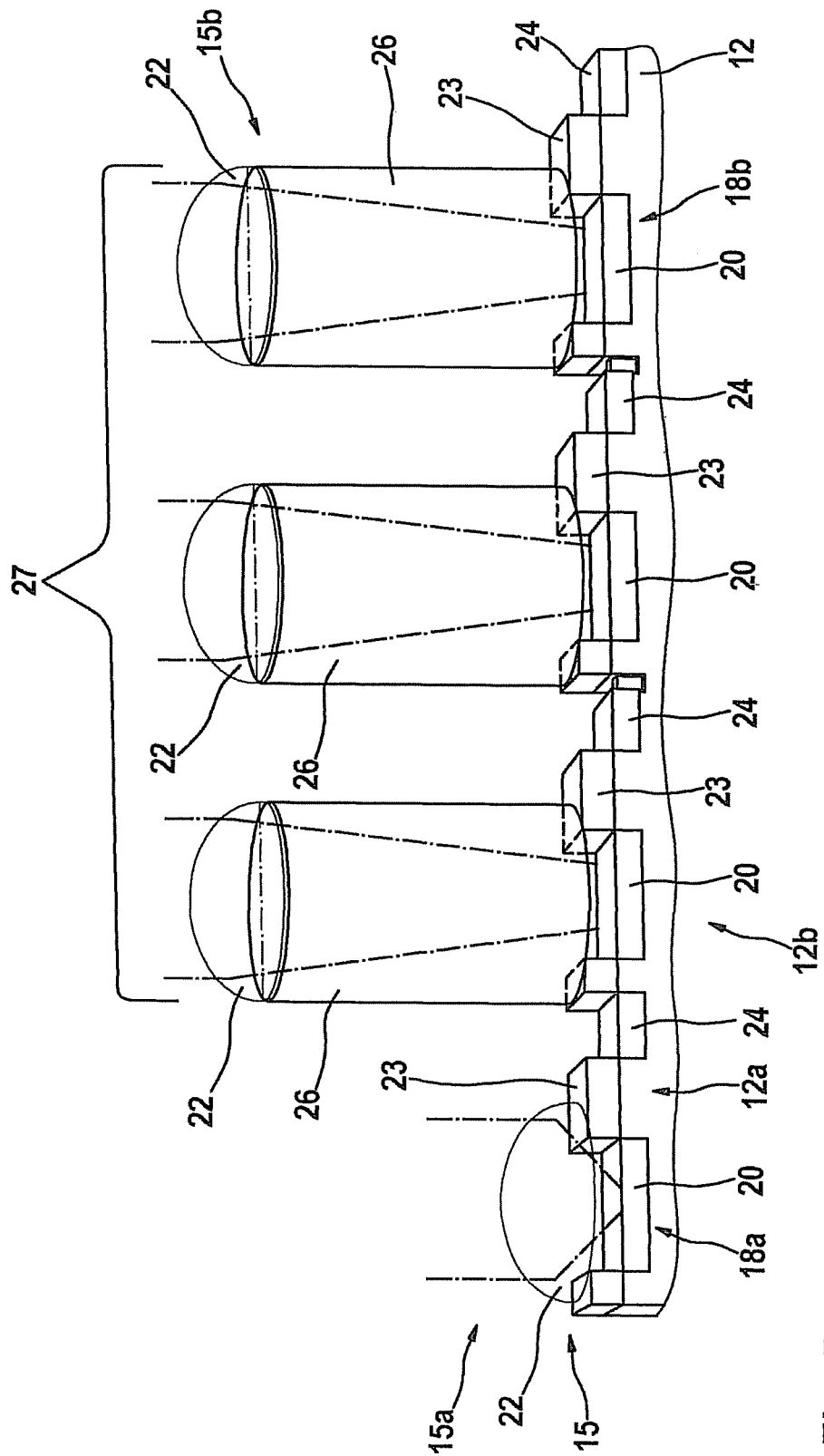
FIG. 5 shows the additional optical unit according to a specific embodiment, having a block of microlenses having light-conducting tubes.

According to FIG. 5, in second imager region 12b a block 27 of offset microlenses 22 for a plurality of second pixels 18b is provided as second optical elements 15b. Here, for example block 27 can also cover all second pixels 18b, i.e., the entire second imager region 12b.

Figure 6:
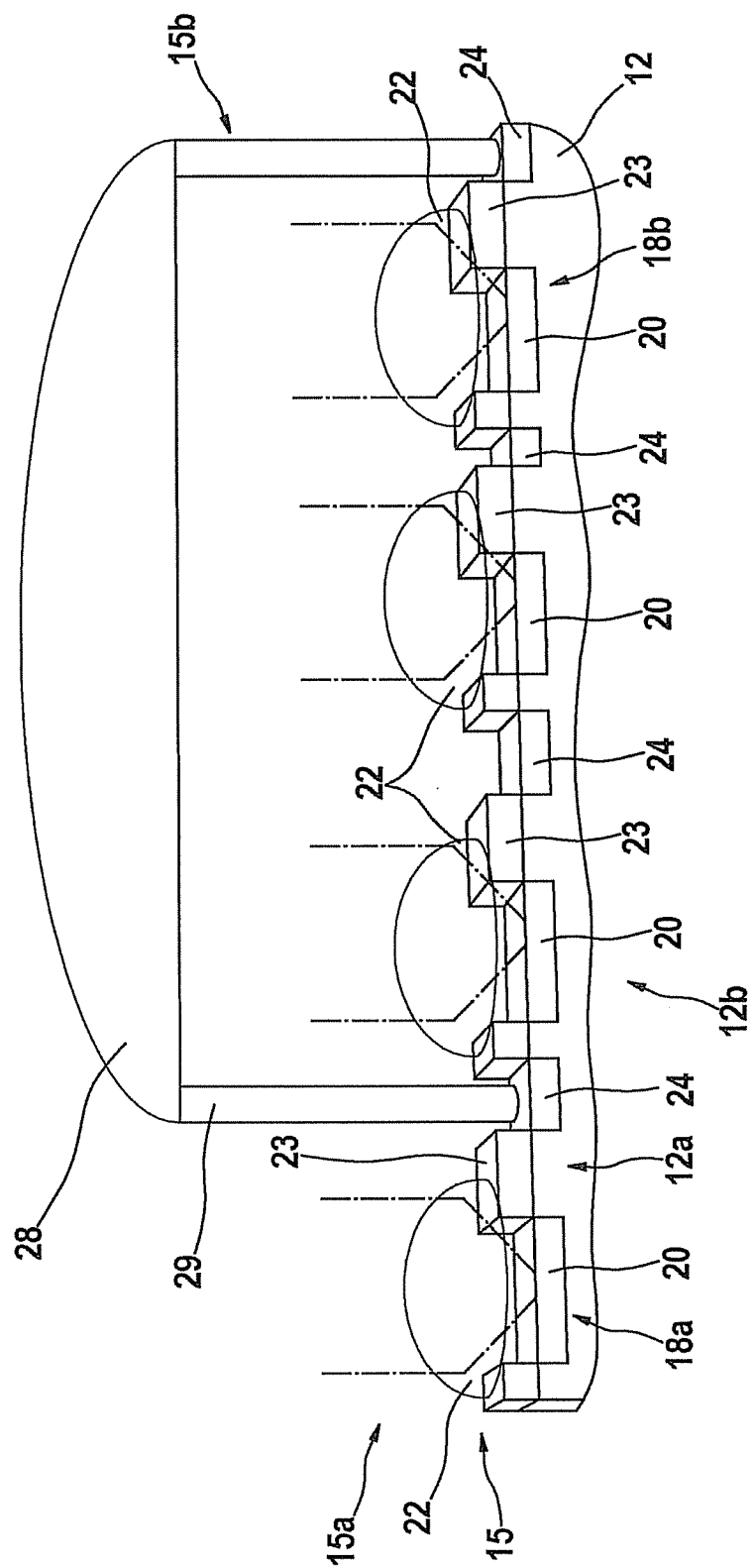
FIG. 6 shows a specific embodiment of the additional optical unit having a lens that covers a plurality of pixels, with a spacer.
Figure 7:
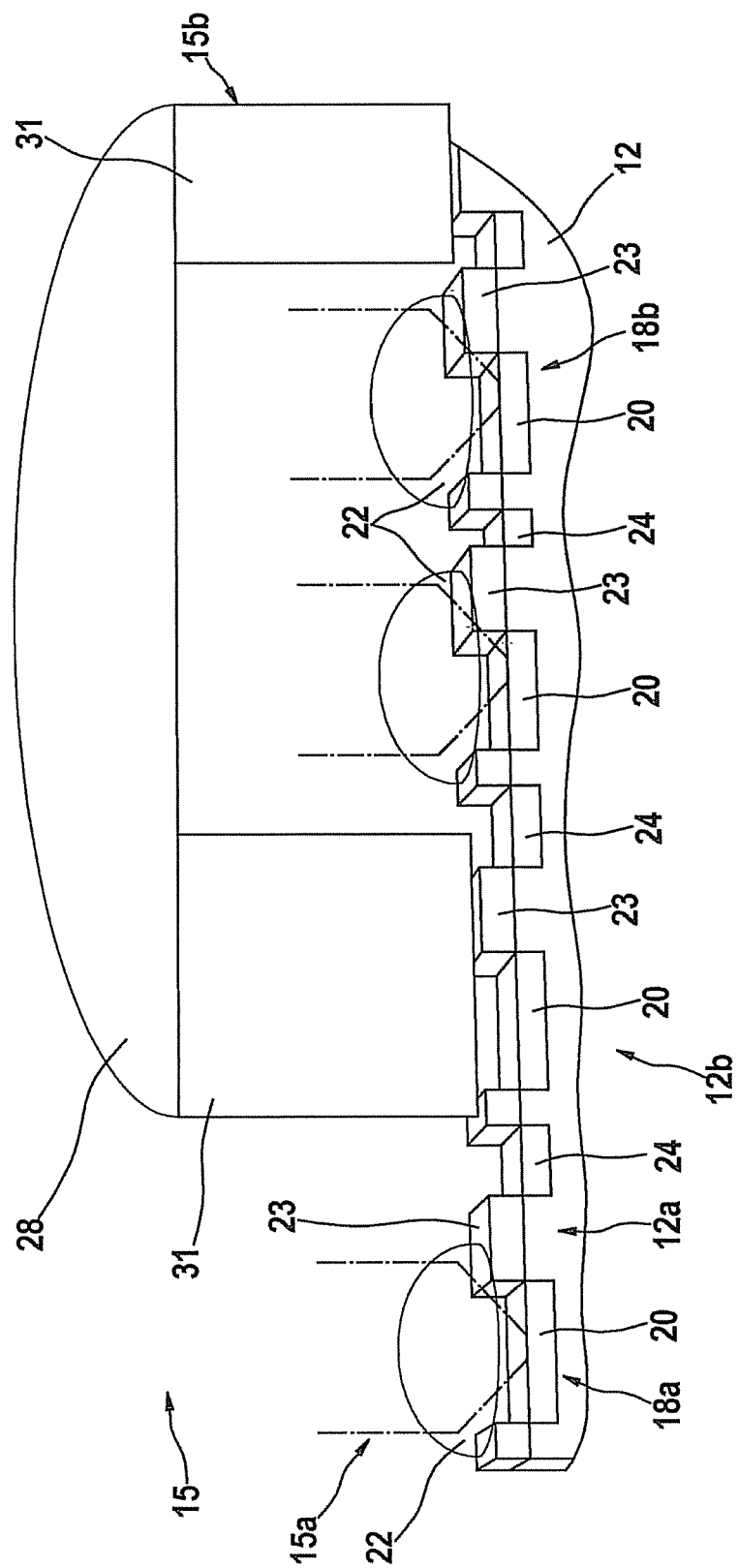
FIG. 7 shows another specific embodiment of an additional optical unit having lens and spacer.

According to FIG. 6, in second imager region 12b microlenses 22 are placed directly onto second pixels 18b, and in addition larger, second microlenses 28 are provided using spacers 29, and cover a plurality of second pixels 18b. In FIG. 7, spacers 31 each include a second pixel 18b.

Figure 8:
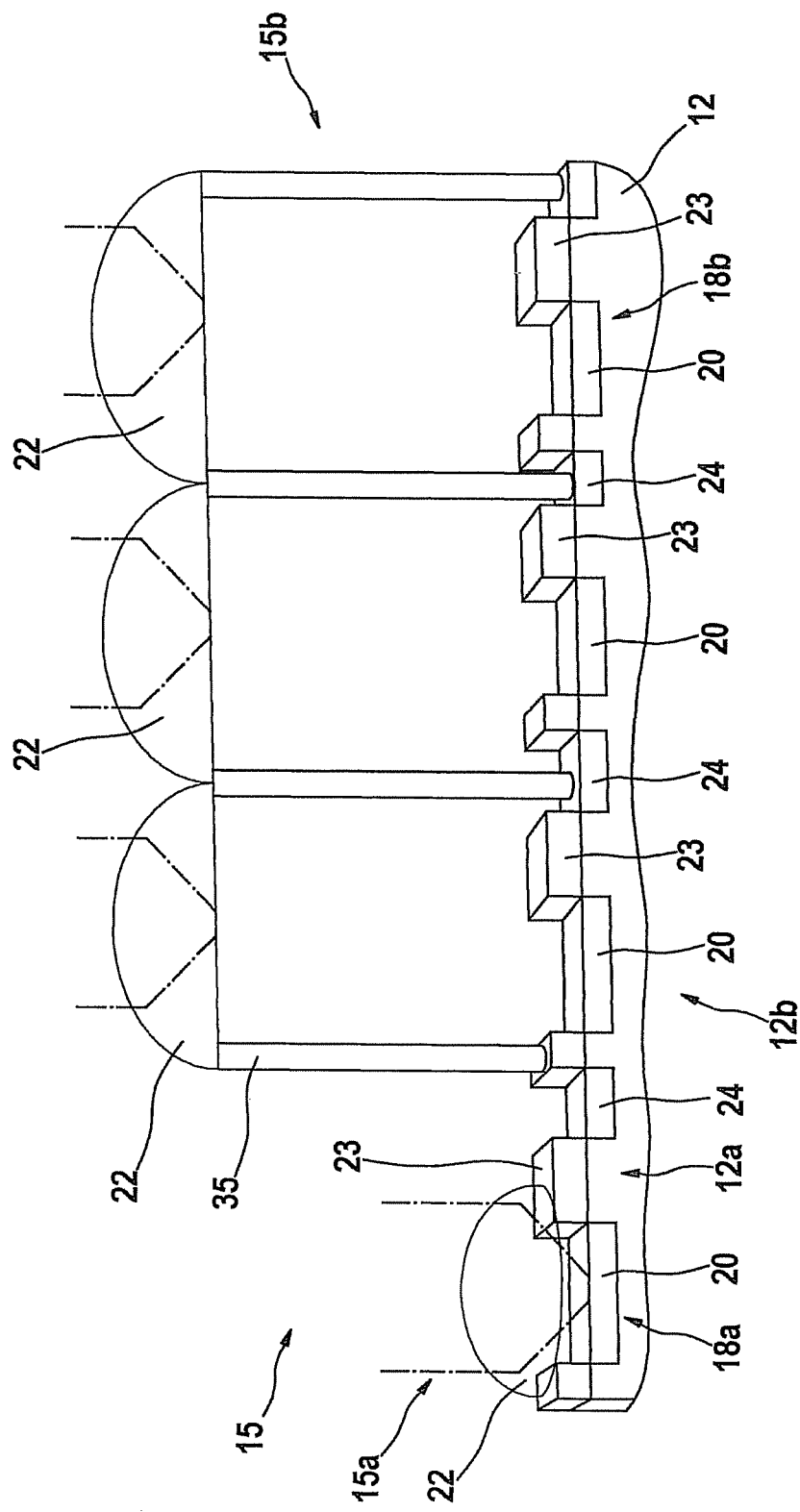
FIG. 8 shows a specific embodiment of the additional optical unit having raised lenses and spacers.

FIG. 8 shows a specific embodiment in which in second imager region 12b higher spacers 35 are attached over second pixels 18b, i.e., without microlenses 22 placed directly onto pixels 18. Here, spacers 35 can each be suitably placed lower, so that the depicted system is only intended as an example.

In FIG. 8, e.g., uniform microlenses 22 can thus be used, so that through suitable choice of spacers 35 the desired focusing or compensation of the image planes can be achieved. In FIGS. 6 and 7 as well, a uniform, larger microlens 28 can be used that is adapted to the respective system through the selection of corresponding spacers 29, 31.

Figure 9:
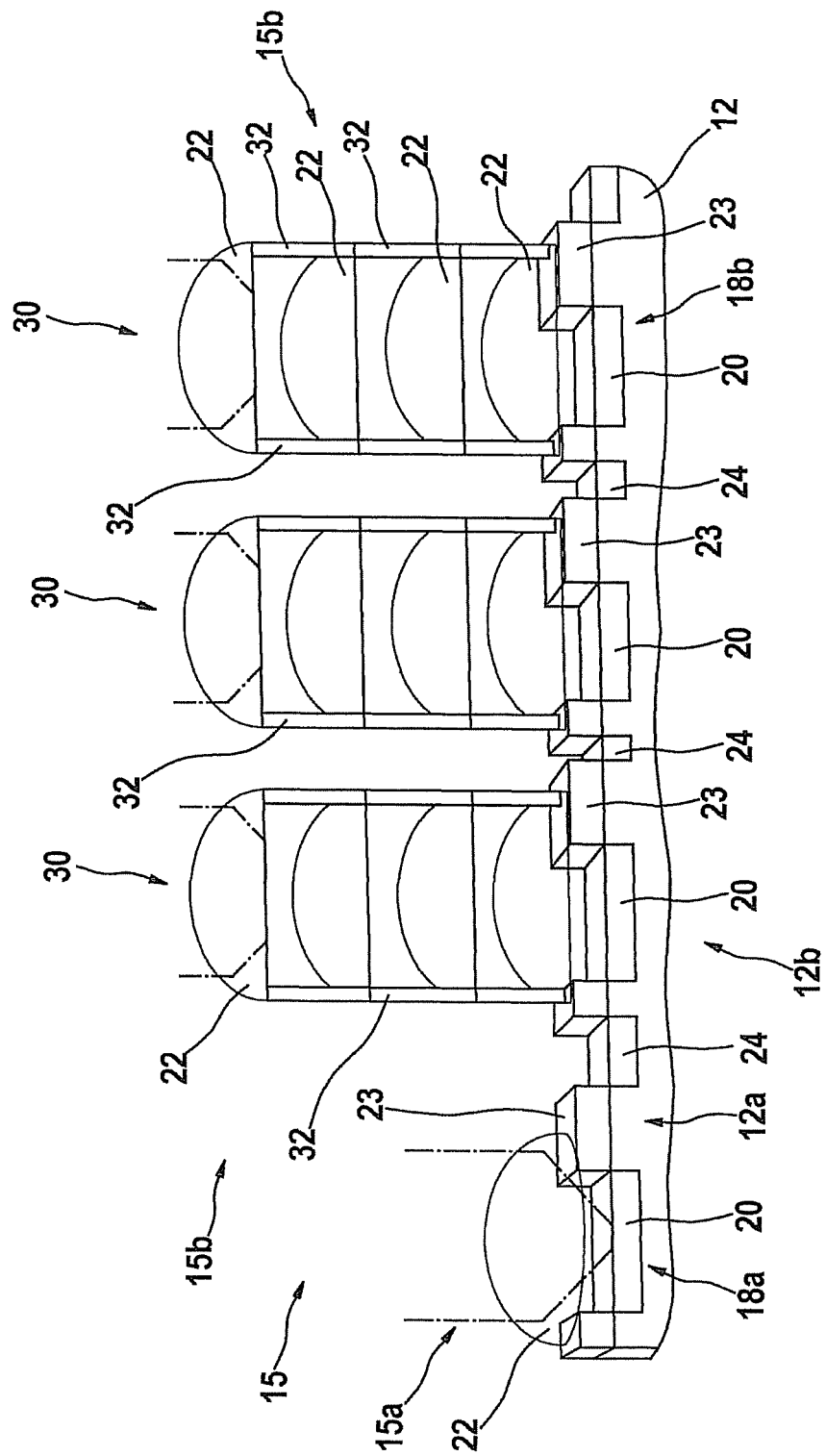
FIG. 9 shows a specific embodiment of the additional optical unit having a plurality of stacks of microlenses.
Figure 10:
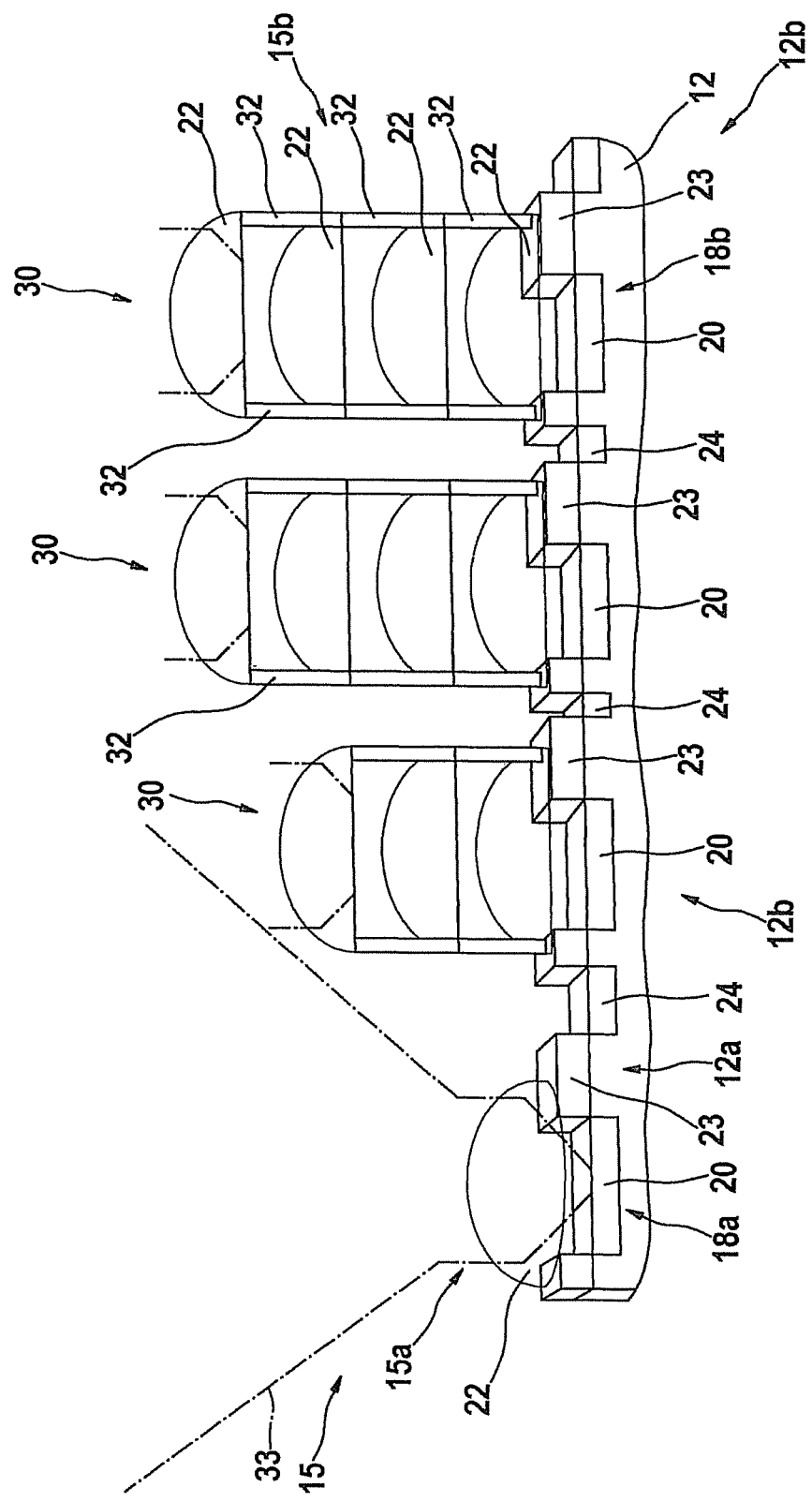
FIG. 10 shows another specific embodiment of the additional optical unit having a plurality of stacks of microlenses having variable stack height.

According to the specific embodiment shown in FIGS. 9 and 10, first imager region 12a is in turn fashioned in a manner corresponding to the previous specific embodiments, i.e., each having a microlens 22 before each pixel 18. In second imager region 12b, lens stacks 30, each made up of a plurality of microlenses 22, are attached at second pixels 18b as optical elements. Thus, a further microlens 22 is successively attached to each of the lowest microlenses 22 as described in the previous specific embodiments via a shorter spacer 32, etc. Thus, this design can be realized by uniform microlenses 22 using a suitable number of spacers 32. In principle, it is also possible for example to stack a plurality of microlenses 22 in first imager region 12a as well, and to correspondingly stack a larger number of microlenses 22 in second imager region 12b.

According to the specific embodiment shown in FIG. 10, the respectively outermost lens stack 30, adjoining first imager region 12a, can if warranted be mounted lower in order not to impair or occlude the angle of view or angle of incidence 33 of the adjacent pixel 18a. If warranted, a plurality of adjacent lens stacks 30, e.g., including the next but one, can also be mounted at a somewhat shorter height.

Figure 11:
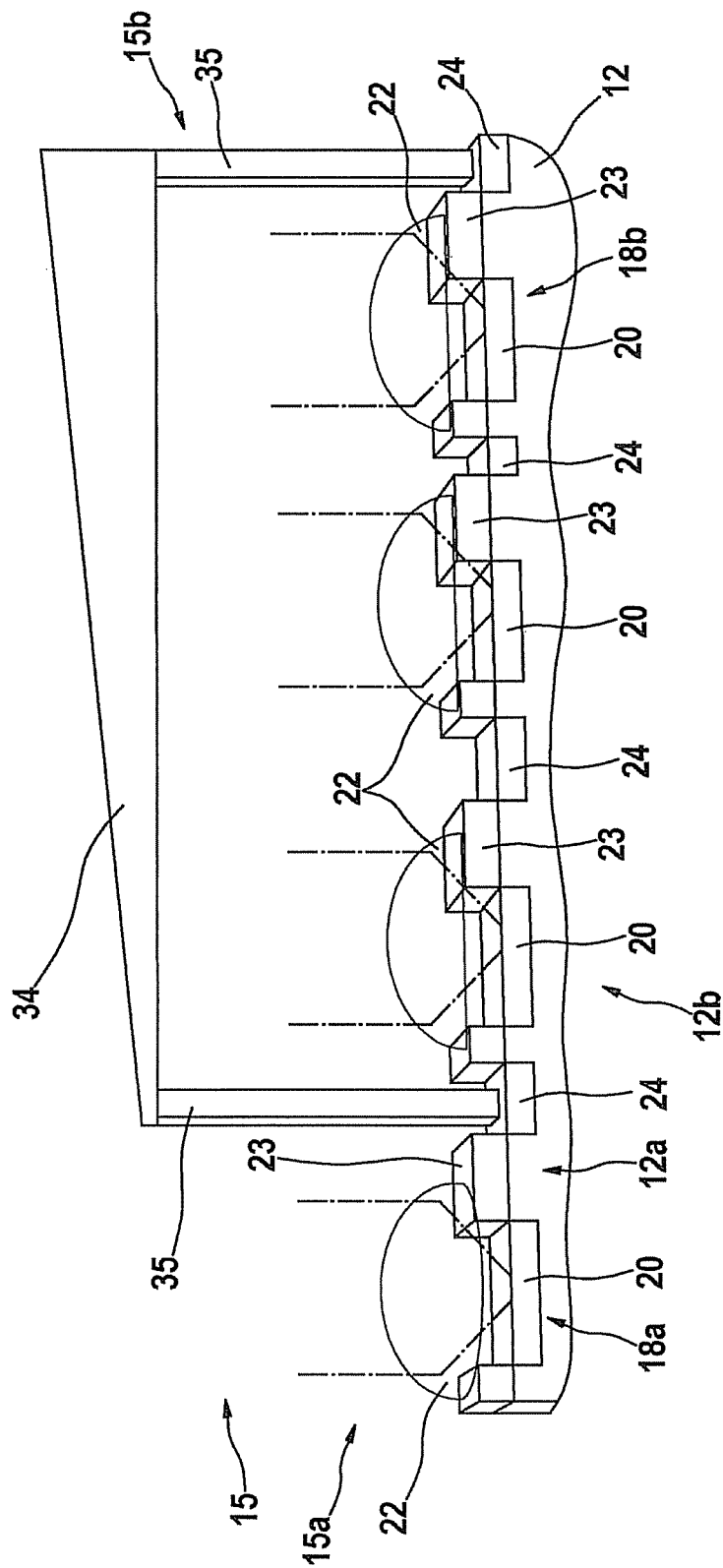
FIG. 11 shows a specific embodiment of the additional optical unit having a prism situated in front.

According to the specific embodiment shown in FIG. 11, microlenses 22 are in turn situated on second pixels 18b of second imager region 12b, as on first pixels 18a. In addition, for a plurality of second pixels 18b, one or more prefixed prisms 34 are mounted as additional optical elements using suitable spacers 35, corresponding to large microelements 28 in FIG. 7.

Figure 12:
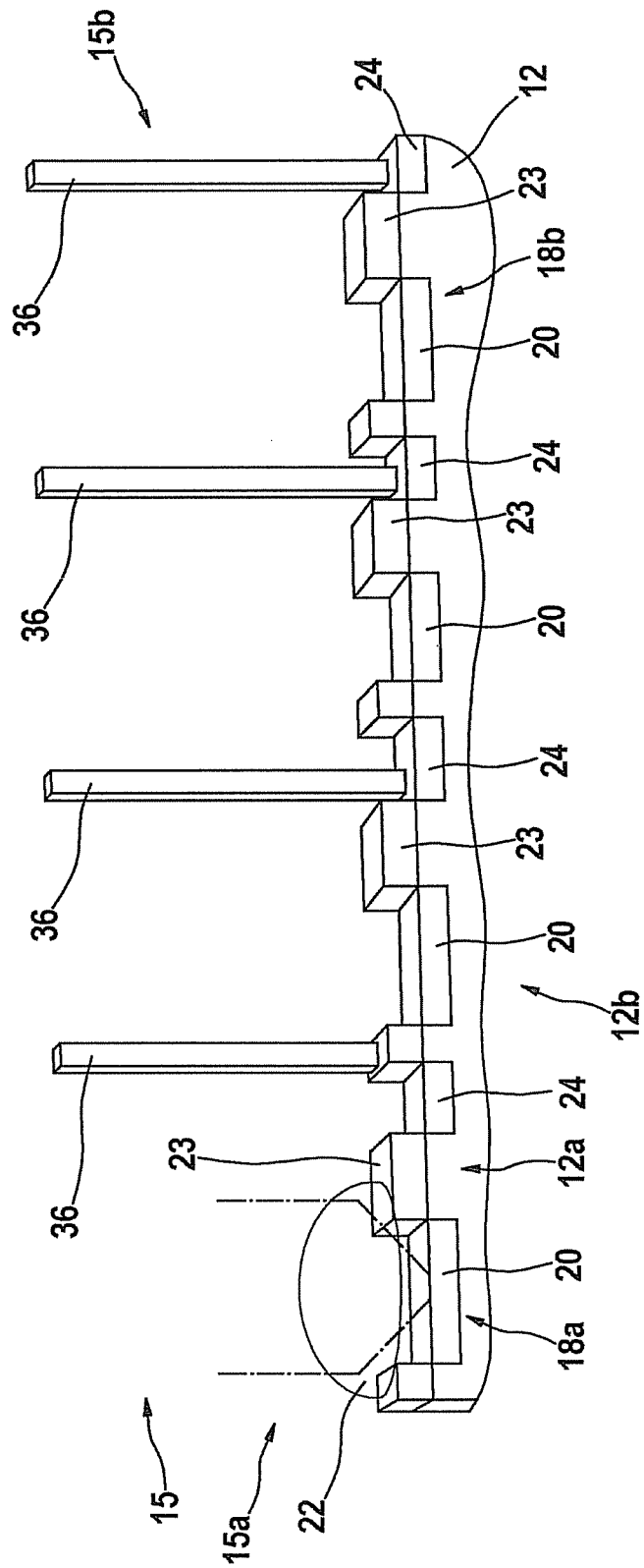
FIG. 12 shows a specific embodiment of the additional optical unit having reflective separating walls.

According to the specific embodiment shown in FIG. 12, in second imager region 12b reflective separating walls 36 are situated around second pixels 18b or between them, which conduct incident light to photodiodes 20 of respective second pixels 18b. Reflective separating walls 36 can in particular also be fashioned as pipes or conducting shafts having for example a rectangular cross-section. They can for example be made of metal and can be retrofitted as a module.

Figure 13:
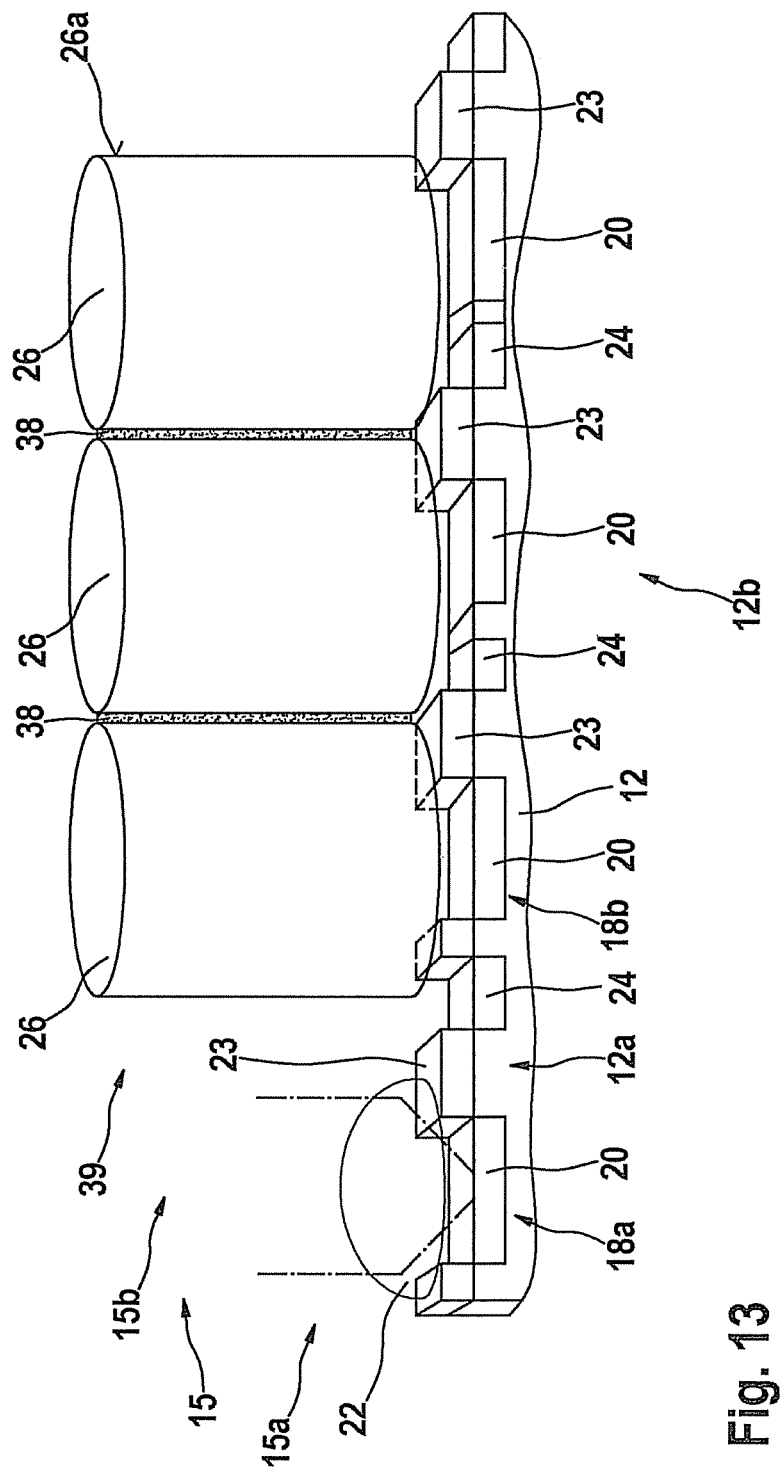
FIG. 13 shows a specific embodiment of the additional optical unit having a bundle of light-conducting tubes.
Figure 14:
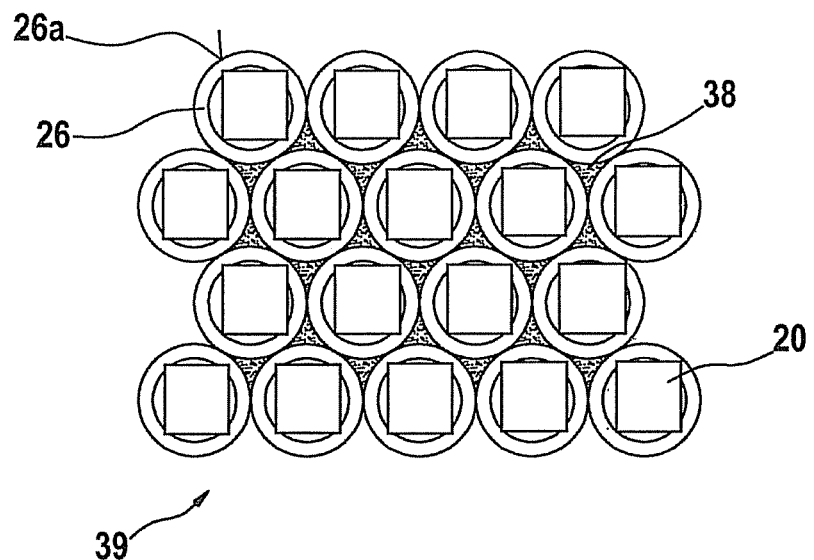
FIG. 14 shows a view from below of FIG. 13.
Figure 15:
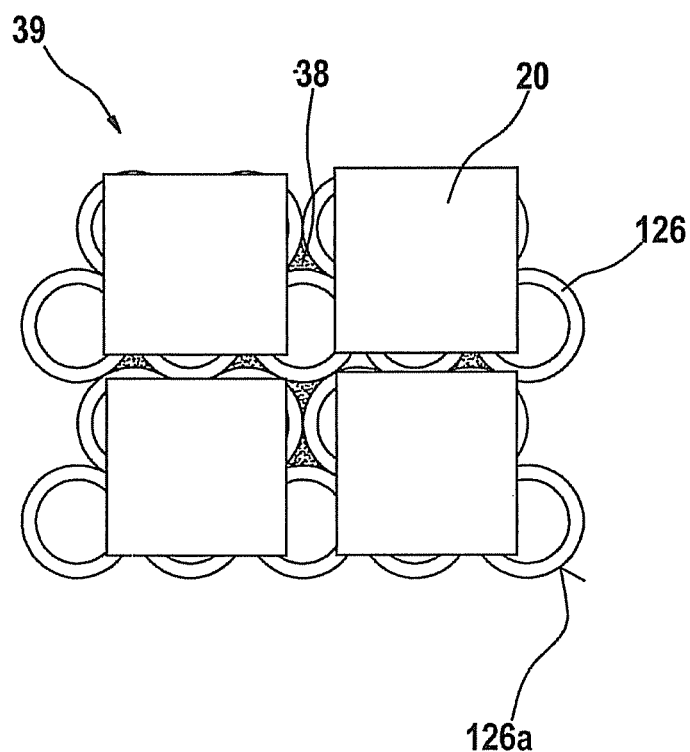
FIG. 15 shows a view from below of a specific embodiment modified relative to FIG. 13, having a plurality of light-conducting tubes per photodiode.

In the specific embodiment shown in FIGS. 13 through 15, in second imager region 12b a plurality of light-conducting tubes 26, in particular light fibers 26, already shown in FIGS. 4 and 5, are provided as second additional optical elements. The specific embodiment of FIG. 13 can thus also be interpreted as an optical inversion of FIG. 12. Here, glass fibers 26 having optically opaque jackets 26a can be used, which can be fashioned for example by coloring or by differing indices of refraction. Glass fibers 26 are glued to one another using glue 38 to form thick strands 39. From these strands 39, spacer pieces having the thickness of the image distance that is to be shortened can then be cut off using, e.g., a knife or a laser.

According to FIG. 14, given suitable choice of glass fibers 26 or of their jacket diameter, exactly one glass fiber 26 can be used per photodiode 20. Advantageously, photodiodes 20 are offset relative to one another, as shown in FIG. 14.

In FIG. 14, a relatively high degree of positioning precision is required. Alternatively, according to the specific embodiment shown in FIG. 15 the diameter of a glass fiber 126 can be selected significantly smaller than the edge length of photodiode 20, so that the positioning precision is no longer so great, and in addition the demands on the optical insulating effect between glass fibers 126 are reduced, because in FIG. 15 a light beam running along an incorrect path has to penetrate a plurality of jackets 126a in order to have a disturbing effect on another photodiode 20; such a transversely traveling light beam is damped by the series of transitions.

In addition, however, the diameter of a glass fiber 26 can be greater than the period distance of photodiodes 20; this specific embodiment can be used in particular for the analysis of the window surface and/or for light detection, because the demands made on resolution are not as great as in the case of far field detection.

Thus, according to the present invention, combinations are possible in which optical elements, e.g., microlenses 22, are attached at first pixels 18a of first imager region 12a, and in addition optical elements according to the various specific embodiments are attached at second pixels 18b of second region 12a.

In principle, different microlenses, e.g., made of different material or having a different index of refraction and/or different shape, may also be attached in imager regions 12a, 12b.

What is claimed is:

1. A camera for a vehicle, for monitoring an exterior environment, comprising:
    an imager having a plurality of pixels, the imager including a first imager region and a second imager region for different object distances;
    an objective situated in front of the imager; and
    an additional optical unit situated between the objective and the imager, imaging characteristics of the additional optical unit differing between the first and second imager regions of the imager such that a focal length differs from the first imager region to the second imager region of the imager, wherein the additional optical unit at least one of:
    i) is unmovable relative to the objective and the imager; and
    ii) includes, for each of the first and second imager regions, respective optical microelements situated between (a) the objective and (b) each pixel or a plurality of pixels of the respective imager region, a distance between the microelements situated in front of the first imager region and its respective pixels being different than a distance between the microelements situated in front of the second imager region and its respective pixels.

2. The camera as recited in claim 1, wherein an optical system formed by the objective and the additional optical unit has at least one of different focal lengths, and different object distances, for the different imager regions.

3. The camera as recited in claim 1, wherein the additional optical unit is fastened to the imager or an imager bearer.

4. The camera as recited in claim 1, wherein the additional optical unit has microlenses that are attached in front of each pixel of at least one of the first imager region and the second imager region, the microlenses being convex and being made of a transparent material and being fashioned above a respective photodiode of the pixel.

5. The camera as recited in claim 4, wherein a respective microlens is placed on first pixels of the first imager region and on second pixels of the second imager region, and an optical arrangement is arranged to cover a plurality of the second pixels of the second imager region.

6. The camera as recited in claim 1, wherein lens stacks of a plurality of microlenses stacked via spacers are placed on some of the pixels.

7. The camera as recited in claim 1, wherein a respective microlens is placed on some of the pixels of the second imager region via spacers.

8. The camera as recited in claim 1, wherein light-conducting devices which conduct incident light to a respective pixel, are situated in front of some of the pixels of the second imager region.

9. The camera as recited in claim 8, wherein the light-conducting devices include at least one of reflective separating walls and light-conducting tubes.

10. The camera as recited in claim 1, wherein the first imager region is set to acquire a surrounding environment of the vehicle with an infinite object distance setting, and the second imager region is set to a finite object distance.

11. The camera as recited in claim 1, wherein the second imager region is set to the finite object distance for acquisition of an external side of a vehicle window.

12. A camera system, comprising:
a camera for a vehicle, for monitoring an exterior environment, the camera including an imager having a plurality of pixels, the imager including a first imager region and a second imager region for different object distances, an objective situated in front of the imager, and an additional optical unit situated between the objective and the imager, imaging characteristics of the additional optical unit differing between the first and second imager regions of the imager such that a focal length differs from the first imager region to the second imager region of the imager; and
a camera mount for attachment to a vehicle window;
wherein:
for adjustment of imaging of an acquired region of a window external side, at least one of i) the camera is displaceable on the camera mount, and ii) a system made up of the objective and the imager is displaceable within a camera housing borne by the camera mount; and
the additional optical unit at least one of:
i) is unmovable relative to the objective and the imager; and
ii) includes, for each of the first and second imager regions, respective optical microelements situated between (a) the objective and (b) each pixel or a plurality of pixels of the respective imager region, a distance between the microelements situated in front of the first imager region and its respective pixels being different than a distance between the microelements situated in front of the second imager region and its respective pixels.

13. A vehicle, comprising:
a vehicle window;
a camera including an imager having a plurality of pixels, the imager including a first imager region and a second imager region for different object distances, an objective situated in front of the imager, and an additional optical unit situated between the objective and the imager, imaging characteristics of the additional optical unit differing between the first and second imager regions of the imager such that a focal length differs from the first imager region to the second imager region of the imager; and
a camera mount to fasten the camera to an inner side of the window;
wherein:
the first imager region images through the window a first acquisition of an environment surrounding the vehicle with a comparatively large object distance using the additional optical unit and the objective, and the second imager region images via the additional optical unit and the objective a region with a comparatively smaller object distance; and
the additional optical unit at least one of:
i) is unmovable relative to the objective and the imager; and
ii) includes, for each of the first and second imager regions, respective optical microelements situated between (a) the objective and (b) each pixel or a plurality of pixels of the respective imager region, a distance between the microelements situated in front of the first imager region and its respective pixels being different than a distance between the microelements situated in front of the second imager region and its respective pixels.

14. The vehicle as recited in claim 13, wherein at least one of the imager regions is on the environment side of the window.

15. The vehicle as recited in claim 13, wherein at least one of: (i) the camera is displaceable on the camera mount, and (ii) a system made up of the objective and the imager is displaceable within a camera housing borne by the camera mount, in a direction not parallel to the inner side of the window.

16. The camera as recited in claim 1, wherein light-conducting devices, which are situated in front of at least some of the pixels of the second imager region, conduct incident light to a respective pixel via internal beam guiding.

17. The camera as recited in claim 1, wherein the additional optical unit includes, for each of the first and second imager regions, the respective optical microelements situated between (a) the objective and (b) the each pixel or the plurality of pixels of the respective imager region, the distance between the microelements situated in front of the first imager region and its respective pixels being different than the distance between the microelements situated in front of the second imager region and its respective pixels.

18. The camera as recited in claim 17, wherein the microelements situated in front of the first imager region and the microelements situated before the second imager region are stacked to varying heights.

19. The camera as recited in claim 1, wherein the microelements are microprisms that are attached in front of each pixel of at least one of the first imager region and the second imager region.

20. The camera as recited in claim 1, wherein the additional optical unit is unmovable relative to the objective and the imager.

21. The camera as recited in claim 1, wherein the additional optical unit simultaneously has the different imaging characteristics for the first and second imager regions.

22. The camera as recited in claim 17, wherein at least one of: (i) spacers are placed between the microelements situated in front of the first imager region and its respective pixels and (ii) the microelements situated before the first imager region are raised from its respective pixels.

* * * * *